(12) United States Patent
Guo et al.

(10) Patent No.: US 11,162,670 B2
(45) Date of Patent: Nov. 2, 2021

(54) BACKLIGHT MODULE AND DISPLAY DEVICE

(71) Applicant: WUHAN CHINA STAR OPTOELECTRONICS TECHNOLOGY CO., LTD., Hubei (CN)

(72) Inventors: Chunpeng Guo, Hubei (CN); Chunhung Huang, Hubei (CN); Gonghua Zou, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 601 days.

(21) Appl. No.: 16/302,645

(22) PCT Filed: Sep. 14, 2018

(86) PCT No.: PCT/CN2018/105693
§ 371 (c)(1),
(2) Date: Nov. 18, 2018

(87) PCT Pub. No.: WO2020/019441
PCT Pub. Date: Jan. 30, 2020

(65) Prior Publication Data
US 2021/0222860 A1 Jul. 22, 2021

(30) Foreign Application Priority Data
Jul. 26, 2018 (CN) .......................... 201810830589.6

(51) Int. Cl.
*B32B 3/26* (2006.01)
*B32B 7/12* (2006.01)
(Continued)

(52) U.S. Cl.
CPC .............. *F21V 23/002* (2013.01); *F21V 7/24* (2018.02); *H05K 9/0067* (2013.01); *B32B 3/26* (2013.01);
(Continued)

(58) Field of Classification Search
CPC . H05K 9/0067; H01L 27/1214; H01L 27/124; H01L 27/1244; H01L 27/1259;
(Continued)

(56) References Cited

U.S. PATENT DOCUMENTS

2006/0221641 A1\* 10/2006 Yoon .................... G02B 6/0068
362/623
2017/0055335 A1 2/2017 Wang et al.

FOREIGN PATENT DOCUMENTS

CN 105090831 A 11/2015
CN 105093684 A 11/2015
(Continued)

*Primary Examiner* — Alicia J Sawdon
(74) *Attorney, Agent, or Firm* — Soroker Agmon Nordman

(57) ABSTRACT

A backlight module and a display device are provided in the present invention. The backlight module includes a bottom polyester layer, an adhesive layer, a top coat layer, a silver reflective layer, an anchor coat layer, a polyester layer, and a grounding wire which overlap each other in sequence. A through hole in contact with the silver reflective layer is formed through the polyester layer and the anchor coat layer. The grounding wire is electrically connected to the silver reflective layer via the through hole.

12 Claims, 3 Drawing Sheets

(51) Int. Cl.
  *B32B 15/04* (2006.01)
  *B32B 15/08* (2006.01)
  *B32B 27/36* (2006.01)
  *F21V 23/00* (2015.01)
  *F21V 7/24* (2018.01)
  *H05K 9/00* (2006.01)

(52) U.S. Cl.
  CPC ............... *B32B 7/12* (2013.01); *B32B 15/04* (2013.01); *B32B 15/08* (2013.01); *B32B 27/36* (2013.01); *B32B 2307/21* (2013.01); *B32B 2457/20* (2013.01)

(58) Field of Classification Search
  CPC ..... B32B 15/04; B32B 15/08; B32B 2307/21; B32B 2457/20; B32B 27/36; B32B 3/26; B32B 7/12
  See application file for complete search history.

(56) References Cited

FOREIGN PATENT DOCUMENTS

| | | | |
|---|---|---|---|
| CN | 105717708 A | * | 6/2016 |
| CN | 105717708 A | | 6/2016 |

* cited by examiner

BACKLIGHT MODULE AND DISPLAY DEVICE

FIELD OF DISCLOSURE

The present invention relates to the field of display device techniques and, in particular, to a backlight module and a display device.

DESCRIPTION OF RELATED ART

A display device generally includes a backlight module and a display module. The display module is a well-developed technology, so it is more and more difficult to find new ways to further reduce production costs of the display module. Thus, it is important for technicians to study various technologies to create a solution for reducing the production costs of the backlight module and the display device.

Please refer to FIG. 1 that shows a conventional backlight module, which has a relatively low-cost structure. The relatively low-cost structure includes a polyester film 16, an anchor coat layer 15, a silver reflective layer 14, a top coat layer 13, an adhesive layer 12, and a bottom polyester film 11 overlapping each other in sequence. In the above-mentioned layer structure, the silver reflective layer 14 is a metal layer having electrical conductivity. Except for the silver reflective layer 14, all layers are electrically insulating.

During manufacturing of the backlight module, a large size substrate is manufactured in a unified process. Then, the large size substrate is cut according to predetermined specifications. After cutting, edges of the silver reflective layer 14 are exposed to the outside. When static electricity occurs, the silver reflective layer 14 absorbs electric charges near it. Due to capacitances, a capacitance is formed by the silver reflective layer 14, a metal wire, and a layer of insulation between the silver reflective layer 14 and the metal wire. When electric charges in the silver reflective layer 14 are accumulated, the metal wire inside the display panel receives a shock resulting from coupling, so wires inside the display panel are damaged. Therefore, there is a demand to invent a backlight module and a display device which can solve the above-mentioned problem.

SUMMARY

The present invention provides a backlight module and a display device to solve a problem that metal wires are damaged by electrostatic shocks when electric charges are accumulated in a silver reflective layer of the backlight module.

According to one aspect of the present invention, a backlight module is provided, including:
 a bottom polyester layer;
 an adhesive layer disposed on the bottom polyester film;
 a top coat layer disposed on the adhesive layer;
 a silver reflective layer disposed on the top coat layer;
 an anchor coat layer disposed on the silver reflective layer;
 a polyester layer disposed on the anchor coat layer;
 a grounding wire disposed on the polyester layer;
 wherein a through hole in contact with the silver reflective layer is formed through the polyester layer and the anchor coat layer, the grounding wire is electrically connected to the silver reflective layer via the through hole, the backlight module further comprises a backlight source and a power supply circuit, and the power supply circuit includes the grounding wire.

According to one embodiment of the present invention, the through hole includes a first through hole and a second through hole, and the first through hole and the second through hole are disposed at two ends of the polyester layer respectively.

According to one embodiment of the present invention, the grounding wire is electrically connected to the silver reflective layer via at least one of the first through hole and the second through hole.

According to one embodiment of the present invention, the through hole penetrates the polyester layer and the anchor coat layer.

According to another aspect of the present invention, a backlight module is provided, including:
 a grounding layer;
 an adhesive layer disposed on the grounding layer;
 a top coat layer disposed on the adhesive layer;
 a silver reflective layer disposed on the top coat layer;
 an anchor coat layer disposed on the silver reflective layer;
 a polyester layer disposed on the anchor coat layer;
 wherein a through hole in contact with the silver reflective layer is formed through the top coat layer and the adhesive layer, and the silver reflective layer is electrically connected to the grounding layer via the through hole.

According to one embodiment of the present invention, the grounding layer is a metal layer.

According to one embodiment of the present invention, the grounding layer includes a white polyester portion and a metal frame surrounding the white polyester portion, and the silver reflective layer is electrically connected to the metal frame via the through hole.

According to one embodiment of the present invention, the backlight module further comprises a grounding wire, the grounding layer is a bottom polyester layer, and the bottom polyester layer is electrically connected to the grounding wire.

According to still another aspect of the present invention, a display device is provided. The display device includes a backlight module and a display module. The backlight module is the backlight module of any of claims 1 to 9.

According to yet still another aspect of the present invention, a backlight module is provided, including:
 a bottom polyester layer;
 an adhesive layer disposed on the bottom polyester layer;
 a top coat layer disposed on the adhesive layer;
 a silver reflective layer disposed on the top coat layer;
 an anchor coat layer disposed on the silver reflective layer;
 a polyester layer disposed on the anchor coat layer;
 a grounding wire disposed on the polyester layer;
 wherein a through hole in contact with the silver reflective layer is formed through the polyester layer and the anchor coat layer, and the grounding wire is electrically connected to the silver reflective layer via the through hole.

According to one embodiment of the present invention, the through hole includes a first through hole and a second through hole, and the first through hole and the second through hole are disposed at two ends of the polyester layer respectively.

According to one embodiment of the present invention, the grounding wire is electrically connected to the silver reflective layer via at least one of the first through hole and the second through hole.

According to one embodiment of the present invention, the through hole penetrates the polyester layer and the anchor coat layer.

The backlight module and the display device of the present invention has the following advantages. The silver reflective layer is grounded via the through hole, so electric charges of the silver reflective layer can be discharged to prevent the silver reflective layer from getting electrostatic shocks to influence other components, thus providing protection to the backlight module against electrostatic shocks.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, a person having ordinary skill in this field can obtain other figures according to these figures without an inventive work or paying the premise.

DETAILED DESCRIPTION OF EMBODIMENTS

Embodiments of the present disclosure are described in detail with reference to the accompanying drawings as follows. Directional terms such as up/down, right/left and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

The present invention provides a backlight module and a display device. The present invention solves the problem that metal wires are damaged by electrostatic shocks when electric charges are accumulated in a silver reflective layer of a backlight module.

Detailed descriptions of the present disclosure and embodiments thereof are illustrated below in conjunction with the accompanying drawings.

Figure 1:
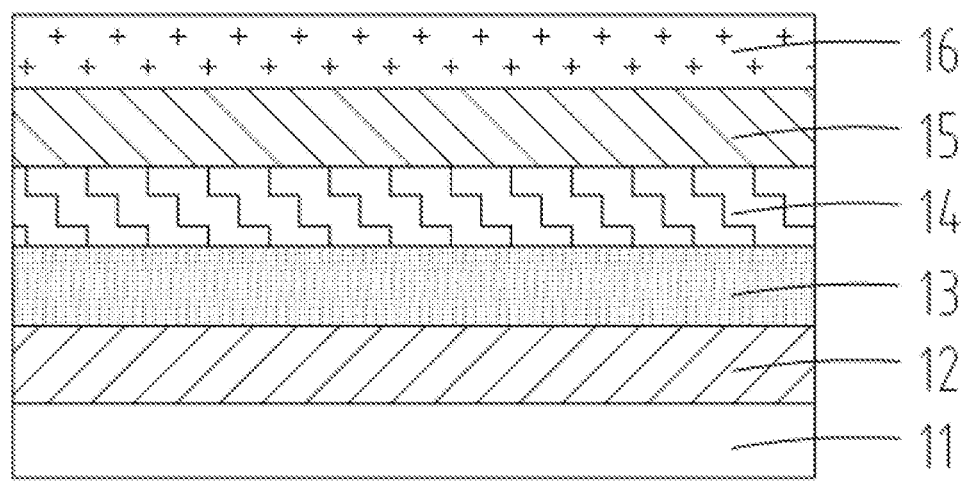
FIG. 1 is a schematic view showing a structure of a conventional backlight module.
Figure 2:
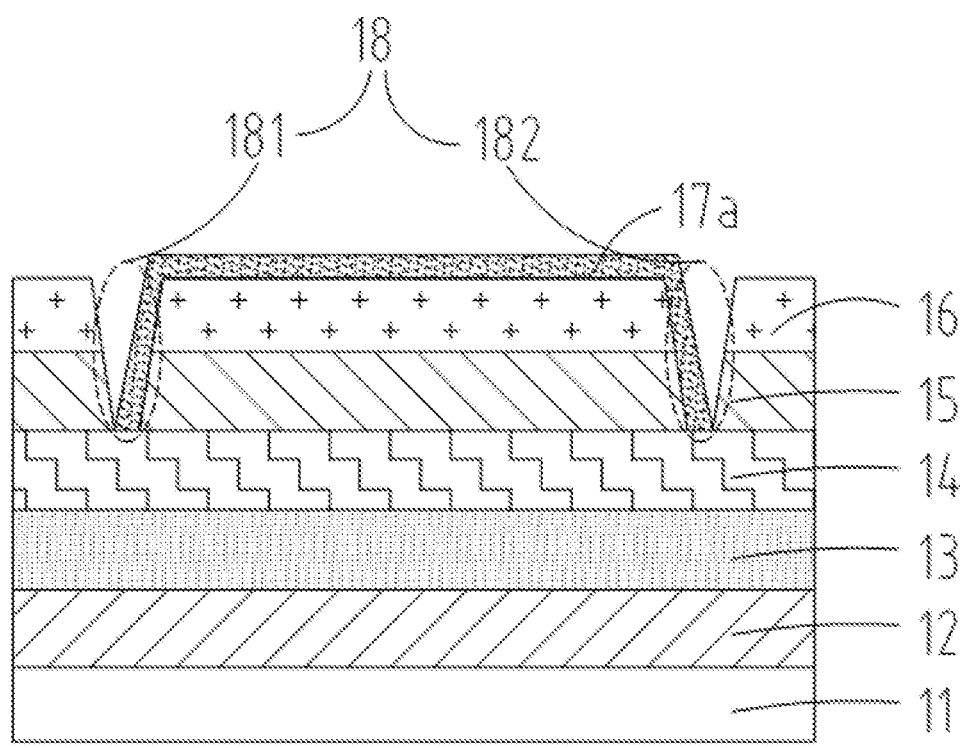
FIG. 2 is a schematic view showing a structure of a backlight module according to a first embodiment of the present invention.

Referring to FIG. 2, a backlight module is provided according to the first embodiment of the present invention, the backlight module including:

A bottom polyester layer 11 (e.g., a white polyester film): The bottom polyester layer 11 is also called a bottom layer of the backlight module, which serves to protect and support the backlight module. The bottom polyester layer 11 is usually made of a polyester material.

An adhesive layer 12 disposed on the bottom polyester layer 11: The adhesive layer 12 has stronger adhesion for adhering together the bottom polyester layer 11 and a top coat layer 13.

The top coat layer 13 disposed on the adhesive layer 12: To be specific, the top coat layer 13 is used to increase the brightness of light emitted from the backlight module.

A silver reflective layer 14 disposed on the top coat layer 13: The silver reflective layer 14 is usually made of metal. Therefore, when the silver reflective layer 14 is exposed after a cutting operation, the exposed silver reflective layer 14 attracts electric charges near it. Furthermore, between the silver reflective layer and a metal wire in the backlight module is a layer of insulation, which generates capacitance to further result in electrical coupling with other power-on components in the backlight module. When the capacitance causes electrostatic shocks, other power-on components in the backlight module thus receives electrostatic shocks and are damaged. The aim of the present invention is to solve the above-mentioned problem.

An anchor coat layer 15 disposed on the silver reflective layer 14: The anchor coat layer 15 is used to adhere together the silver reflective layer 14 and a polyester layer 16.

The polyester layer 16 disposed on the anchor coat layer 15: Generally speaking, the polyester layer 16 is fixed to the backlight module to insulate other structure of the backlight module from the environment outside it.

It should be noted that, in the backlight module, all layers are electrically insulating, except the silver reflective layer 14.

A grounding wire 17a disposed on the polyester layer 17a;

wherein a through hole 18 in contact with the silver reflective layer 14 is formed through the polyester layer 16 and the anchor coat layer 15, and the grounding wire 17a is electrically connected to the silver reflective layer 14 via the through hole 18, so that electric charges of the silver reflective layer 14 are discharged to ground to prevent other components of the backlight module from being damaged.

It is preferable that the through hole 18 includes a first through hole 181 and a second through hole 182, and the first through hole 181 and the second through hole 182 are disposed at two ends of the polyester layer 16 respectively. This way, when electric charges are discharged from the silver reflective layer 14, other structures/layers are less affected. It should be appreciated that, the through hole 18 includes, but is not limited to, at least one of the two kinds of through holes mentioned above, and the through hole 18 can also include more than two through holes. The number of the through holes may vary according to actual demands of the backlight module.

Furthermore, the grounding wire 17a is electrically connected to the silver reflective layer 14 via at least one of the first through hole 181 and the second through hole 182, so as to discharge the electric charges of the silver reflective layer 14 to the ground, thereby preventing capacitance from being generated with other metal wire.

Preferably, the through hole 18 penetrates the polyester layer 16 and the anchor coat layer 15.

To be specific, the backlight module further comprises a backlight source and a power supply circuit, and the power supply circuit includes the grounding wire 17a.

Figure 4:
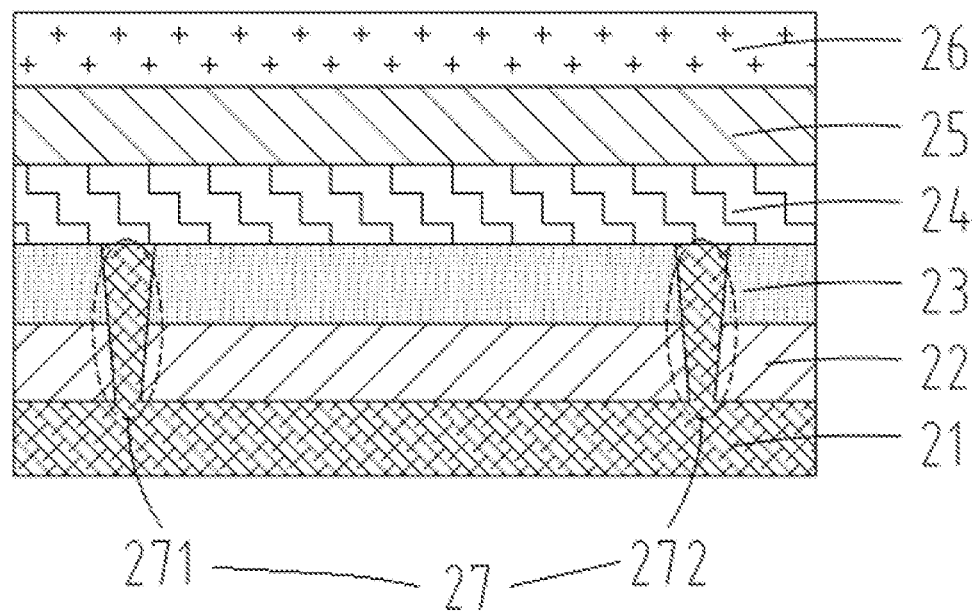
FIG. 4 is a schematic view showing the structure of the backlight module according to a third embodiment of the present invention.

Referring to FIG. 4, the present invention provides a backlight module according to the third embodiment, which includes:

a grounding layer 21;
an adhesive layer 22 disposed on the grounding layer 21;
a top coat layer 23 disposed on the adhesive layer 22;
a silver reflective layer 24 disposed on the top coat layer 23, wherein the silver reflective layer 24 is usually made of metal, so, when the silver reflective layer 24 is exposed after cutting, the exposed silver reflective layer 24 attracts electric charges near it. In prior art, between a silver reflective layer and a metal wire in a conventional backlight module is a layer of insulation which causes generation of capacitance that leads to electrical coupling with other power-on components in the backlight module. When the capacitance causes electrostatic shocks, other power-on components in the backlight module thus receive electrostatic shocks and are damaged. The aim of the present invention is to solve the above-mentioned problem existing in prior art.

an anchor coat layer 25 disposed on the silver reflective layer 24;

a polyester layer 26 disposed on the anchor coat layer 25;

wherein a through hole 27 in contact with the silver reflective layer 24 is formed through the top coat layer 2324 and the adhesive layer 22, and the silver reflective layer 24 is electrically connected to the grounding layer 21 via the through hole 27.

It is preferable that he grounding layer 21 is a metal layer. The grounding layer 21 is electrically connected to the silver reflective layer 24 via the through hole 27, so that the electric charges in the silver reflective layer 24 can be discharged to the ground.

It is preferable that, the through hole 27 includes the first through hole 271 and the second through hole 272. The first through hole 271 and the second through hole 272 are disposed at two ends of the polyester layer 26 and the anchor coat layer 25. This way, when electric charges are discharged from the silver reflective layer 24, other structures/layers are less affected. It should be appreciated that, the through hole 27 includes, but is not limited to, at least one of the two kinds of through holes mentioned above, and the through hole 27 can also include more than two through holes. The number of the through holes may vary according to actual demands of the backlight module.

To be specific, the grounding layer 21 is electrically connected to the silver reflective layer 24 via at least one of the first through hole 271 and the second through hole 272, so the electric charges of the silver reflective layer 24 are discharged to the ground to prevent generation of capacitance with other metal wire.

The through hole 21 preferably penetrates the top coat layer 23 and the adhesive layer 22. It should be noted that, the grounding layer 21 is a metal layer. Therefore, to increase a fixing effect of the backlight module, it is required that the adhesive layer 22 has strong adhesion to adhere together the grounding layer 21 and the top coat layer 23.

According to one embodiment of the present invention, the grounding layer 11 includes a white polyester portion and a metal frame surrounding the white polyester portion, and the silver reflective layer 14 is electrically connected to the metal frame via the through hole. By using the metal frame to surround the white polyester portion, there is no need to change the material of the bottom polyester layer in order to discharge the electric charges of the silver reflective layer 14 to the ground, and therefore functionality of the backlight module is not affected.

Figure 3:
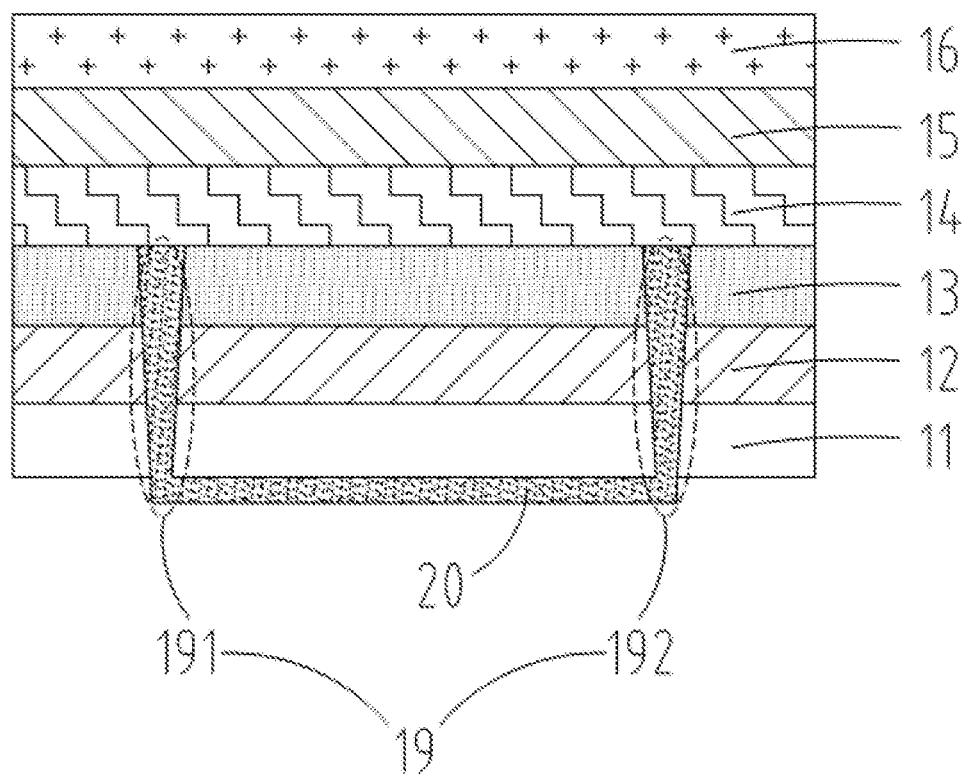
FIG. 3 is a schematic view showing the structure of the backlight module according to a second embodiment of the present invention.

Referring to FIG. 3 showing the second embodiment of the present invention, the present invention further comprises a grounding wire 20, the grounding layer 11 is a bottom polyester layer, and the bottom polyester layer is electrically connected to the grounding wire 20 so as to discharge the electric charges in the silver reflective layer to the ground.

Furthermore, in order to electrically connect the grounding wire 20 to the silver reflective layer 14, the grounding layer 11 includes an overlapping through hole disposed corresponding to the through hole 19 for electrically connecting the grounding wire 20 to the silver reflective layer 14.

In detail, the backlight module further comprises a backlight source and a power supply circuit, and the power supply circuit includes the grounding wire 20.

According to another aspect of the present invention, a display device is provided. The display device includes a backlight module and a display module, and the backlight module is the backlight module according to any of claims 1 to 9.

The display device and the backlight module have similar working principles. Readers can refer to the working principles of the backlight module for more details of the working principles of the display device, so a detailed description thereof is omitted herein for brevity.

The present invention has the following advantages. The present invention provides the backlight module and the display device. By means of the through hole, the silver reflective layer is grounded to discharge the electric charges of the silver reflective layer to thereby prevent the silver reflective layer from receiving electrostatic shocks and affecting other components, thus providing protection to the backlight module against electrostatic shock.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A backlight module, comprising:
a bottom polyester layer;
an adhesive layer disposed on the bottom polyester layer;
a top coat layer disposed on the adhesive layer;
a silver reflective layer disposed on the top coat layer;
an anchor coat layer disposed on the silver reflective laver;
a polyester layer disposed on the anchor coat layer;
a grounding wire disposed on the polyester layer;
wherein a through hole in contact with the silver reflective layer is formed through the polyester layer and the anchor coat layer, the grounding wire is electrically connected to the silver reflective layer via the through hole, the backlight module further comprises a backlight source and a power supply circuit, and the power supply circuit includes the grounding wire.

2. The backlight module according to claim 1, wherein the through hole includes a first through hole and a second through hole, the first through hole and the second through hole are disposed at two ends of the polyester layer respectively.

3. The backlight module according to claim 2, wherein the grounding wire is electrically connected to the silver reflective layer via at least one of the first through hole and the second through hole.

4. The backlight module according to claim 1, wherein the through hole penetrates the polyester layer and the anchor coat layer.

5. A backlight module, comprising:
a grounding layer,
an adhesive layer disposed on the grounding layer;
a top coat layer disposed on the adhesive layer;
a silver reflective layer disposed on the top coat layer;
an anchor coat layer disposed on the silver reflective layer;
a polyester layer disposed on the anchor coat layer;

wherein a through hole in contact with the silver reflective layer is formed through the top coat layer and the adhesive layer, and the silver reflective layer is electrically connected to the grounding, layer via the through hole.

6. The backlight module according to claim 5, wherein the grounding layer is a metal layer.

7. The backlight module according to claim 5, wherein the grounding layer includes a white polyester portion and a metal frame surrounding the white polyester portion, and the silver reflective layer is electrically connected to the metal frame via the through hole.

8. The backlight module according to claim 5, further comprising a grounding wire, the grounding layer being a bottom polyester layer, the bottom polyester layer being electrically connected to the grounding wire.

9. A display device, comprising a backlight module and a display module stacked on each other, the backlight module comprising:
a grounding layer;
an adhesive layer disposed on the grounding, layer;
a top coat layer disposed on the adhesive layer;
a silver reflective layer disposed on the top coat layer;
an anchor coat layer disposed on the silver reflective layer;
a polyester layer disposed on the anchor coat layer;
wherein a through hole in contact with the silver reflective layer is formed through the top coat layer and the adhesive layer, and the silver reflective layer is electrically connected to the grounding layer via the through hole.

10. The display device according to claim 9, wherein the grounding layer is a metal layer.

11. The display device according to claim 9, wherein the grounding layer includes a white polyester portion and a metal frame surrounding the white polyester portion, and the silver reflective layer is electrically connected to the metal frame via the through hole.

12. The display device according to claim 9, further comprising a grounding wire, the grounding layer being a bottom polyester layer, the bottom polyester layer being electrically connected to the grounding wire.

* * * * *